(12) United States Patent
Lemelson

(10) Patent No.: US 6,951,985 B1
(45) Date of Patent: Oct. 4, 2005

(54) SUPERCONDUCTING ELECTRICAL CABLE

(76) Inventor: Jerome H. Lemelson, Suite 286, Unite 802, 930 Tahoe Blvd., Incline Village, NV (US) 89451-9436

( * ) Notice: Subject to any disclaimer, the term of this patent is extended or adjusted under 35 U.S.C. 154(b) by 0 days.

(21) Appl. No.: 08/436,096

(22) Filed: May 8, 1995

(51) Int. Cl.$^7$ .............................................. H01B 12/00
(52) U.S. Cl. ................................... 174/125.1; 174/15.4
(58) Field of Search ............................. 174/125.1, 15.4, 174/15.5; 506/230, 232, 233; 385/123, 124, 126, 128, 101

(56) References Cited

U.S. PATENT DOCUMENTS

| | | | | | |
|---|---|---|---|---|---|
| 1,698,704 | A | * | 1/1929 | Middleton et al. ...... | 174/105 X |
| 3,214,249 | A | * | 10/1965 | Bean et al. ............... | 174/125.1 |
| 3,449,092 | A | | 6/1969 | Hammond ................... | 428/635 |
| 3,502,783 | A | * | 3/1970 | Aupoix et al. ............. | 174/15.5 |
| 3,612,742 | A | * | 10/1971 | Snowdon et al. .......... | 174/15.5 |
| 4,078,299 | A | * | 3/1978 | Furuto et al. .................. | 29/599 |
| 4,390,586 | A | | 6/1983 | Lemelson ................... | 428/209 |
| 4,414,428 | A | * | 11/1983 | McDonald ............... | 174/125.1 |
| 4,842,366 | A | | 6/1989 | Sawada et al. ............. | 385/141 |
| 4,849,288 | A | | 7/1989 | Schmaderer et al. ........ | 428/366 |
| 4,861,751 | A | | 8/1989 | Tenhover .................... | 505/434 |
| 4,885,273 | A | | 12/1989 | Sugimoto et al. ........... | 505/433 |

FOREIGN PATENT DOCUMENTS

| | | | | |
|---|---|---|---|---|
| JP | 56-4101 | * | 1/1981 | ................. 385/101 |
| JP | 60-9011 | * | 1/1985 | |

OTHER PUBLICATIONS

Jin et al., "High Tc superconductors–composite wire fabrication", Appl. Phy. Lett., vol. 51, No. 3, pp. 203–204, Jul. 20, 1987.*

Kawamura, Haruki and Kyoji Tachikawa, "Preparation of the Superconducting Nb3Ge Tape by a Continuous CVD Process," *Japanese Journal of Applied Physics*, vol. 16, No. 11, Nov. 1977, pp. 2037–2041.

Jergel, M., et al. "Some Properties of Superconducting Nb3Ge Tape Prepared Continuously by Chemical Vapour Deposition," *Journal of the Less–Common Metals*, vol. 59, 1978, p. 35–41.

Clark et al., "Effects of Radiation Damage in Ion–Implanted Thin Films of Metal Oxide Supereconductors," *Applied Physics Letter* (vol. 51, #2, Jul. 13, 1987).

Aida et al., "Preparation of $YBa_2Cu_3O_{7-x}$ Superconducting Thin Films by RF–Magnetron Sputtering," *Japan Applied Physics*, pp. L1489–L1491 (vol. 26, #9, Sep. 1987).

Inoue et al., "Y–Ba–Cu–O/Nb Tunnel Type Josephson Junctions," *Japan Applied Physics*, pp. L1443–L1444 (vol. 26, #9, Sep. 1987).

Venkatesan, "Laser Deposited High $T_c$ Superconducting Thin Films," *Solid State Technology*, pp. 39–41 (Dec. 1987).

* cited by examiner

*Primary Examiner*—Kamand Cuneo
*Assistant Examiner*—Jeremy Norris
(74) *Attorney, Agent, or Firm*—Louis J. Hoffman

(57) ABSTRACT

An apparatus and method for producing elongated strip, wire or cable, a portion or all of which is defined by electrically superconducting material. An elongated wire, strip or cable is controllably coated with one or more materials which define a superconducting layer thereon or a plurality of such superconducting layers which bond or solidify on the substrate. In a particular form, the superconductor is formed as a layer secured to a wire-like substrate having an outer stratum that is electrically insulative, and a second layer of insulating material is secured to the outer surface of the superconductor layer. In one embodiment, the substrate may be an optically transparent light pipe, such as made of glass.

16 Claims, 4 Drawing Sheets

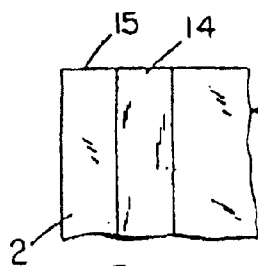
Fig.1
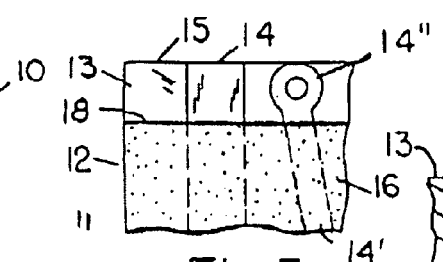
Fig.3
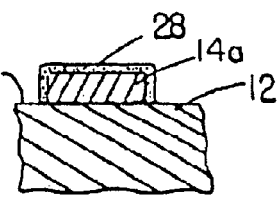
Fig.6
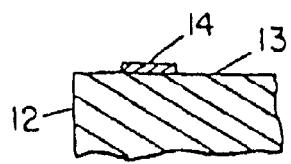
Fig.2
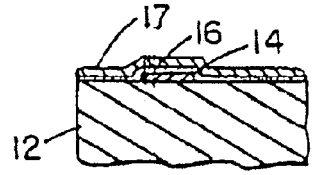
Fig.4
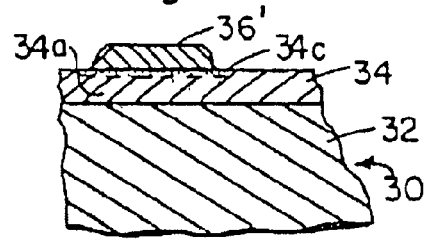
Fig.8
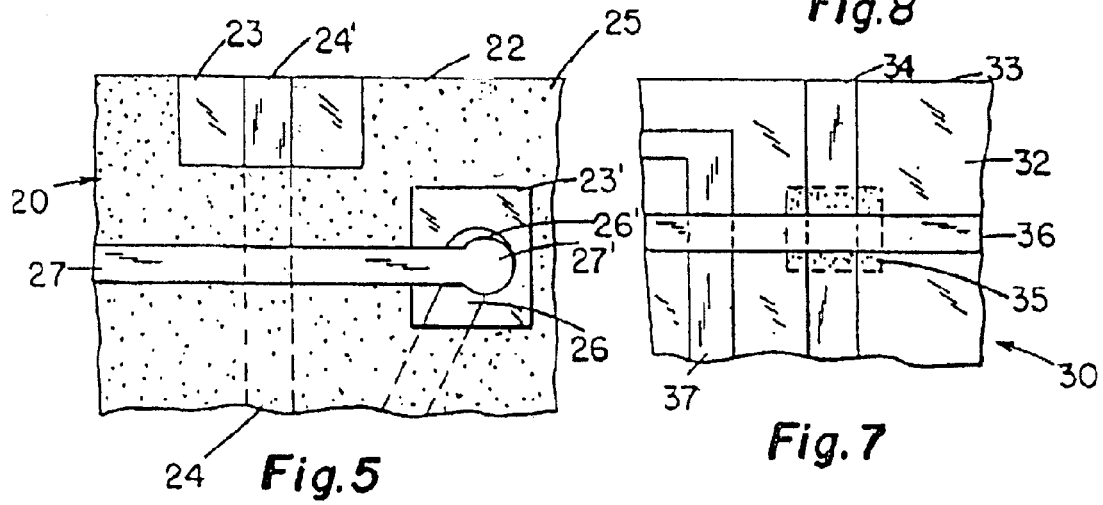
Fig.5
Fig.7
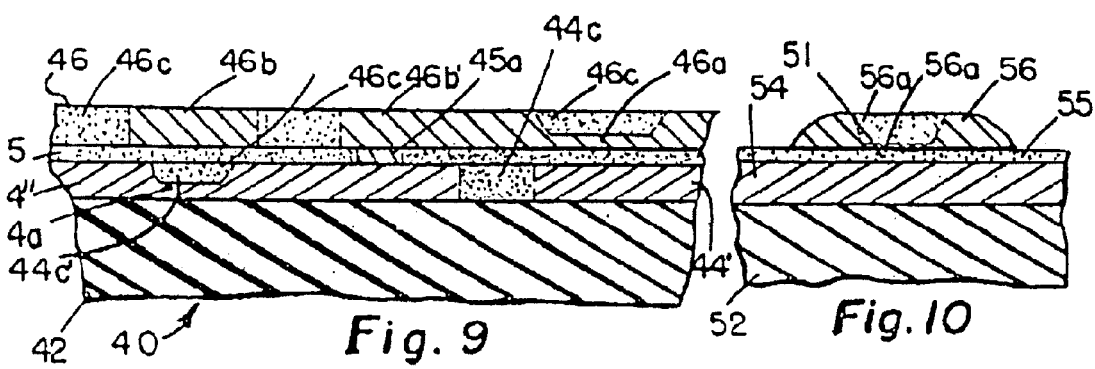
Fig.9
Fig.10
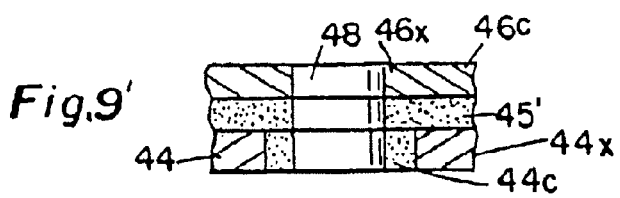
Fig.9'

SUPERCONDUCTING ELECTRICAL CABLE

SUMMARY OF THE INVENTION

This invention relates to an apparatus and method for producing new and improved elongated formations of superconducting material for use as wire or cable in the conduction and storage of electrical energy. The invention is particularly concerned with the continuous production of superconducting wire and cable in substantial lengths thereof which may be utilized for the long distance transmission of electrical energy, the formations of coils or other configurations thereof or a combination of such functions.

In one system, a substrate is formed in the configuration of a round or otherwise shaped wire, strip or cable of a suitable metal or metal alloy. The substrate is thereafter fed, either as it is formed or from a coil supply thereof, back and forth through a suitable coating apparatus or through an elongated chamber, such as a duct or pipe, while suitable material is coated on either a select portion of the outer surface of the substrate or entirely around the substrate and is caused to form a solid layer bonded thereto. Such solid layer may comprise superconducting material or material which is converted to a superconducting form by further chemical and/or radiation processing and/or by controllably doping or impregnating with one or more dopants which operate to impart select superconducting characteristics to the deposited material.

In another form, the surface stratum of the wire, strip or cable is reacted on by one or more chemicals and/or subjected to suitable radiation, for converting same to a suitable superconducting material for a select depth of the substrate.

In yet another form of the invention, a first elongated wire, strip or cable is formed of a first material such as single or multiple wires or fibers of steel, copper aluminum or other metal or metal alloy having an outer surface coated with or forming into an insulating oxide of the metal or a high strength carbon or ceramic or composite and is continuously fed into engagement with a second elongated wire, strip or cable and compressed thereagainst to effect a lamination between the two materials.

The second material may comprise a superconducting material or a material which, when subjected to a chemical reaction and/or radiation within the reaction chamber as it is fed, converts to a superconducting material. The first formed wire or strip serves as a support for the second strip of superconducting material and in one instance, is itself partly converted to a superconductor or serves as a conductor or on which electrical energy passed to or from the superconducting material may be transmitted.

An insulating material may be disposed between the two strips to insulate one from the other while conduction is effected between the two when one or more switches therebetween are automatically closed. Such switch or switches between the two materials may be either electro-mechanical switches and/or solid state gates or switches controlled in their operation by a computer generated signal and/or by signals generated by one or more sensors sensing the operation of the device or conductor of which the superconducting material is made. They may be applied automatically to the composite strip material as it is fed through or from the reaction chamber or attached thereto after it is cut to length.

The layer of superconducting material may be covered per se with a jacket of suitable plastic resin or resins by extrusion coating, or a jacket or jackets of woven ceramic, fiberglass or carbon and suitable resin, or may be coated in the chamber with an insulating material against which one or more layers of such superconducting material may be deposited or formed between respective layers of deposited or in situ formed insulating material to provide a multiple layer superconducting cable providing multiple paths for electrical energy. Said insulating material can comprise a thin layer of synthetic diamond material which is formed in situ on said outer surface.

Accordingly it is a primary object of this invention to provide a new and improved apparatus and method for producing elongated superconducting wire and cable.

Another object is to provide an apparatus and method for continuously producing elongated superconducting wires and cable.

Another object is to provide an apparatus and method for producing composite wires and cable of superconducting material and metal.

Another object is to provide an apparatus and method for continuously producing composite superconducting wire and cable assemblies or laminates.

Another object is to provide an apparatus and method for continuously producing elongated electrically conducting composite material and cable formed in part of a conducting metal and a superconducting material.

Another object is to provide an apparatus and method for continuously producing electrically conducting cable formed of superconducting material, a support such as a cable or wire therefor and an insulating material surrounding same.

Another object is to provide an elongated superconducting wire or cable formed of a plurality of concentric layers of superconducting material separated from each other by respective layers of insulating material to provide a plurality of separate conducting paths along the same cable.

Another object is to provide new and improved structures in hollow superconducting cables for containing heat transfer fluid and/or light conducting means such as light pipes.

BRIEF DESCRIPTION OF DRAWINGS

With the above and such other objects in view as may hereinafter more fully appear, the invention consists of the novel structures, arrangements of components, apparatus and methods which will hereafter be more sully described and illustrated in the accompanying drawings, but it is to be understood changes, variations and modifications may be resorted to which fall within the scope of the invention as claimed.

FIG. 1 is a fragmentary view taken from above a circuit member prior to the further fabrication thereof;

FIG. 2 is an end cross-sectional view of a fragment of FIG. 1;

FIG. 3 shows the circuit member of FIG. 1 processed with an insulating layer which has been formed from a layer of metal or semi-conducting material;

FIG. 4 is a cross-sectional view of a portion of FIG. 3;

FIG. 5 is a plan view of a circuit board showing further details of a structure applicable to electrical circuits;

FIG. 6 is a cross-section of part of a circuit element formed on a base which element has been insulated in situ thereon;

FIG. 7 shows another circuit structure in plan view;

FIG. 8 is a cross-sectional view of another structure of a circuit element and an insulating portion thereof;

FIG. 9 is an end cross-sectional view of a circuit board showing multiple layers of conductors which are dielectrically separated from each other;

FIG. 9' is a fragmentary sectional view of further circuit structure applicable to the other structures illustrated;

FIG. 10 is a fragmentary sectional view of structure and a conductor having been partly converted to a dielectric material;

FIG. 20 is a perspective, cross-sectional view of an improved superconducting cable.

DETAILED DESCRIPTION

Figure 11:
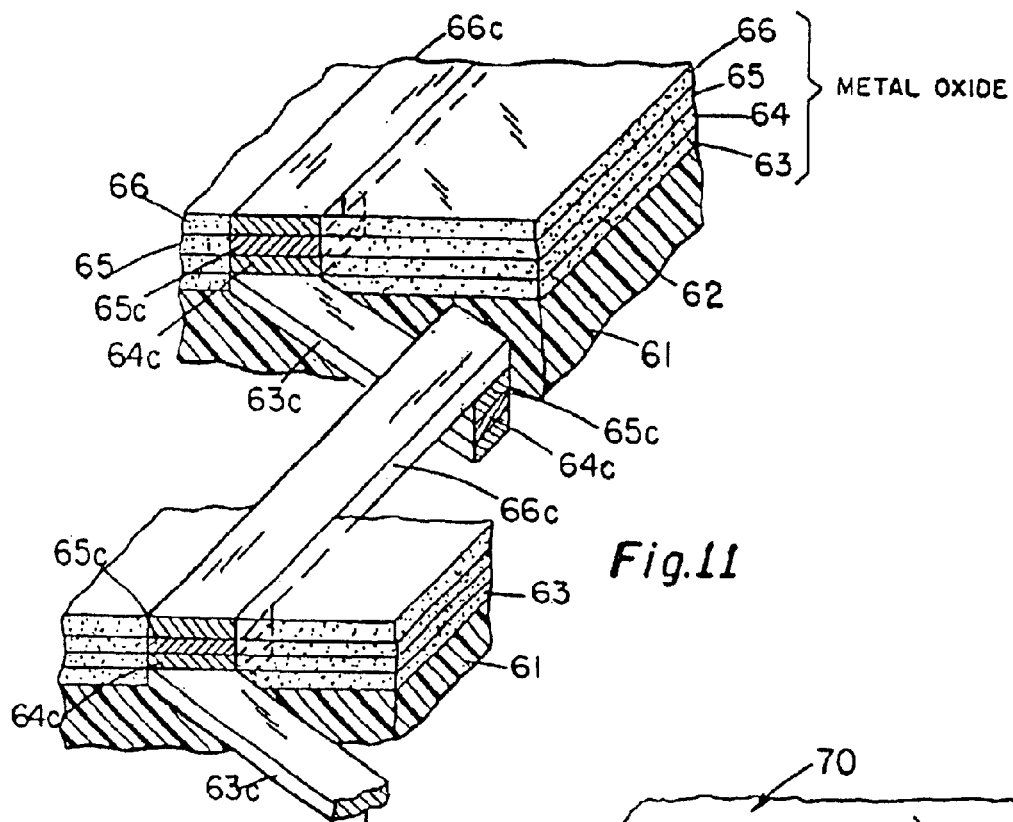
FIG. 11 is a fragmentary sectional view that shows how the multiple layer fabrication techniques of the instant invention may be utilized to form another conductor.

FIGS. 1 and 2 illustrate a portion of an electrical circuit member such as a circuit board or other component consisting of an assembly 10 of a base 12 which is preferably made of insulating material and which has an electrical circuit member 14 bonded or otherwise secured to its upper surface 13 and illustrated as shaped in a thin strip, layer or film of electrically conducting metal. It is assumed that the circuit conductor 14 terminates at or near an edge 15 of the base or board 12 at which end it may be electrically connected to another circuit or an electrical device. The element 14 may have any suitable thickness varying from that of a thin film in the order of microns in thickness or less to that of a strip of metal applied directly to surface 13 per se or formed thereon after etching a larger sheet or coating of metal bonded to 13. In other words, the conducting circuit element 14 may be applied as a sheet of metal to 12, electro-deposited on the upper surface 13 of 12 by various known techniques, or metallised or vacuum coated on 13 either in the shape illustrated or as a uniformly distributed layer which is thereafter shaped by a mechanical or chemical action.

In FIGS. 3 and 4 a coating or film 16 of metal has been applied by vacuum depositing from the vapor state or electro-deposition of said metal completely over substantially all of the exposed surface of said film or strip 14 and preferably over most of the adjacent surface 13 of 12. The entire layer or film 16 is thereafter completely converted to a non-conducting or dielectric material so that it forms an insulating coating for the conductor 14. The notation 18 refers to a line defining the edge of a mask which is placed adjacent the edge 15 of the circuit board 12 either prior to the application of the conducting layer 16 thereto or prior to the application of the material or atmosphere which converts 16 to a dielectric material so that the end portion of 14 is either exposed or consists entirely of an electrically conducting material and may therefore be electrically connected to another component or circuit by soldering, welding or fastening means.

The base 12 may consist of any suitable rigid or flexible insulating material such as thermo-setting plastic, glass, plastic-glass laminates or the like. It may also comprise a sheet of metal the upper surface of which is coated with or converted to an insulating layer on which 14 is deposited or secured. The conductor 14 may consist of any suitable conducting metal. The metal applied as layer 16 may also comprise any suitable metal which may be entirely converted thereafter to a non-conducting compound of said metal. For example, 16 may at first comprise a coating or film of aluminum which is vacuum or electro deposited on 14 end 12. It may thereafter completely be oxidized by exposure to a suitable atmosphere to form a dielectric coating. If the layer comprising 16 is thin enough, it will convert to aluminum oxide in air at room temperature. The process may be hastened for heavier layers of aluminum such as sheet by applying oxidizing gases or vapors thereto. For example, if the coating or film 16 is heated in the range 300 to 600 degrees centigrade and is exposed to an atmosphere of hydrogen fluoride or is exposed to elemental fluorine, the resulting reaction, if sustained long enough, may be used to convert the entire layer 16 to the metal fluoride compound. A coating of said fluoride in the order of 1 to 2 microns in thickness will exhibit a resistance value in the order of $10^{10}$ or more ohms. Depending on the thickness of layer 16, it may be necessary to sustain the reaction for a period of time in which a small portion of the outer layer of conducting element 14 is also reacted on by said oxidizing atmosphere or material and is converted to a dielectric compound to guarantee complete conversion of all the metal of layer 16.

The notation 14' in FIG. 3 refers to a second conducting strip on 12, the end of which is shaped with an eye 14" which is exposed for connection thereto.

In FIG. 5 is illustrated a portion of an electrical device 20 which is fabricated in accordance with the teachings and the technique of FIGS. 1 to 4 and in which a further conducting element is applied to the base. The insulating base 22 may be any suitable shape and is illustrated as a flat sheet or plate. Applied first thereto as described, is a thin strip of conducting material referred to by the notation 24. Applied over that surface of 22 against which 24 is applied, is a coating or film of metal 25 which is entirely converted to a dielectric coating or film as described. The notation 23 refers to a portion of the surface of 22 containing thereon element 24 which does not contain the dielectric covering 25 and is thereby accessible for connection to another circuit device or element. A second circuit element 26 which may also be an extension of 24, extends beneath the dielectric covering 25 against the upper surface of base 22. A second area 23' of the surface of 22 on which the end 26' of 26 extends, is also void of the material of the insulating layer 25. Extending across the upper surface of 25 is a third circuit element 27 which may be applied as a thin strip, coating or film of metal thereto. The strip 27 crosses strip 24 and is insulated therefrom by the layer 25 of dielectric material. The end 27' of 27 is shown as extending across the area 23' and is in surface contact with the end 26' of 26. The element 27 may be applied to 25, 23' and 26' by any of the techniques described for the application of 14 to 12 including vacuum deposition, electro deposition or plating, spraying, or adhesively bonding to 25 with the end 27' thereof welded or soldered to 26'. The structures illustrated in FIG. 5 are applicable to the fabrication of various improved circuit elements and circuits in which a high density of components per unit volume is desired. It can easily be seen that if the circuit elements 24, 26, 27, etc., are applied as thin layers or films and the insulating layer or layers 25 are applied therebetween as thin layers or films, a substantial number of circuits may be constructed as a multiple layer unit with each circuit element or group of elements in one layer separated from those of the next layer as well as from each other by respective layers of deposited metal which has been completely converted to an oxide or other dielectric compound as described.

In another form of the invention it is noted that in constructing a multi-layer circuit element of the types illustrated in FIGS. 1 to 5, one or more of the metal coatings such as 25 may be only partly converted to the oxide or dielectric compound of said metal with remaining portions serving as further circuit elements. Said partial conversion of the dielectric material may be effected by masking those areas of the film or costing to prevent their exposure to the oxidizing atmosphere or chemical, which masking way comprise a removable stencil or may be a coating of a dielectric material applied permanently thereto or stripped therefrom thereafter.

Various modifications in the structures illustrated in FIG. 5 are possible and may include the provision of additional layers of dielectric material and circuit conducting elements over those shown, the securing of separate circuit components to exposed areas of the circuit components such as the end 24' of 24 and 26', which components may be integrally bonded to the base and may also be coated with a dielectric material as described or masked to prevent said coating. Various electrical components such as capacitors, diodes, semi-conductors, resistors and the like may also be applied to 20 and electrically connected to one or more exposed portions of circuit elements deposited or otherwise secured thereto by means of vacuum or electro deposition, spraying or other known techniques for the construction of more elaborate circuits. A mask or masking means may be applied to define the areas of these materials which are deposited on the exposed surface of the base 20, conducting element 27 or dielectric layer 25. In other words, the circuit elements may be formed by selective deposition on the base material, the dielectric layer may be formed by the selective deposition of a metal and/or the selective conversion of all or parts of said metal to an oxide or dielectric compound thereof and the subsequent circuit elements may also be formed by the selective deposition of a metal on the resulting upper surface.

FIG. 6 illustrates a modified form of the embodiment presented in FIGS. 1 to 4 in which only the exposed surface of the circuit element 14a which is bonded to the upper surface 13 of base 12 is coated with an oxide or dielectric layer 28. The layer 28 may be formed by exposing the element 14a to an oxidizing atmosphere or liquid and converting part of it to the oxide of said metal forming layer 28. The outer surface of 14a may also be coated with a film or layer of a metal such as that comprising 16 which may thereafter be converted to its dielectric compound as described. The exposed surface of strip 14a itself may also be converted to the dielectric compound of the metal by treatment with an oxidizing chemical. In other words, the layer 28 of oxidizing material may be made by conversion of the surface layer of said element.

In FIG. 7 is shown a further structure in an electric circuit member or circuit board made in accordance with the teachings of the invention. The assembly 30 comprises a base member such as an insulated sheet or board having a first circuit element 34 in the form of a strip, coating or film deposited or adhesively bonded thereto. A second conductor 36 in the form of a thin, flat strip or film of metal extends lateral to 34 and crosses thereover. The notation 35 refers to an insulating layer of limited area disposed between 34 and 36 in the area of cross-over. The patch 35 may be formed by vacuum or electro-depositing a metal through a mask or stencil after the formation or securing of 34 to 32, directly over that length of 34 across which 36 will pass. Thereafter the patch of metal film or coating 35 is converted, at least in part, to the oxide or dielectric compound of the metal over which strip 36 is deposited or adhesively secured. The notation 37 refers to another conducting strip of metal which has been deposited with strip 34 and is shown electrically connected to 36 which is deposited directly thereon.

FIG. 8 shows a cross-over structure for two circuit elements on the surface of a base 32. The circuit element 34 adjacent 32 is provided of sufficient thickness to permit part of the upper portion or surface layer 34c thereof to be converted to a dielectric oxide layer for a length sufficient for a second circuit element 36' to be deposited or otherwise secured to the upper surface of said strip and to be insulated from the conducting portion thereof. The notation 34a refers to the remaining, lower portion of that segment of 34 which to still conducting. If it is desired to retain the cross-section of the portion 34a of 34 equal to that of the cross-section of the rest of the strip so that the resistance thereof will not be greater than that of the rest of the strip, the strip may be provided of increased width along the length thereof defined by portion 34.

FIG. 9 illustrates additional structures in printed circuit boards and the like provided in accordance with the teachings of this invention. The circuit board or assembly 40 consists of an insulated base 42 on which a first circuit element or elements 44 is deposited or otherwise provided as described. The notation 44c refers to a section of 44 which has been completely converted to an oxide or other compound rendering it a dielectric which devides 44 into two segments, 44' and 44". The conversion of 44c to said oxide of said metal may be effected by masking the remaining surface of 44 and applying an oxidizing atmosphere to the outer surface of 44c for a sufficient time to permit complete conversion of said metal. If 44 is applied as a film or layer coating all or a substantial portion of the upper surface 43 of 42, a circuit in the form of element 44 and others may thus be formed thereof by converting the areas between what will eventually be the conducting elements to the dielectric compound of the metal layer or film from which 44 is formed.

To one side of 44c, a portion of 44" has been partly converted to dielectric material by masking the remainder of the element and exposing the surface of a segment 44c' to a dielectric forming chemical or atmosphere for sufficient time to convert a predetermined thickness thereof to a non-conductor or semi-conductor. The remaining portion 44a of 44" in of substantially less thickness than the rest of 44" and if the strip is of substantially constant thickness, portion 44a will have a higher resistance and may be used as a resistor in the circuit defined in part by 44".

Deposited over 44 is a layer or film of metal which has been converted as described to a dielectric material with the exception of areas such as 45a thereof which have been masked from the oxidizing atmosphere and may be electrically connected to either or both the lower conductor and an upper conductor 46 which has been deposited or otherwise applied thereover. In other words, the dielectric layer 45 may also be used as part of the circuit.

If all layers of a circuit member such as 40 are deposited by vacuum or electrodeposition and circuits are formed thereof as provided in FIG. 9 by conversion of certain areas of each layer to a dielectric material as described without substantially reducing or increasing the thickness of each layer, then, it is noted that each circuit element or conductor will remain in its particular layer and will not extend out of said layer in order to conform to a changing upper surface of the type which results from the selective deposition of conducting circuit elements and components. The significance of such fabrication method is that any number of circuit layers may be stacked one on the other without eventually resulting in a formation with a highly irregular surface on which it is difficult to add or deposit circuit components due to the contour thereof. By the structure and method of FIG. 9 the circuits and components of one layer may be electrically connected to those of the next layer above or below which it is insulated from by the intermediate layer of dielectric material 45 by not converting a portion of said intermediate layer which is in alignment with the circuit elements to be connected. For example, the portion 45a of intermediate layer 45 is retained as a metal by masking it so that it is not converted to the oxide when the upper or outer surface thereof is exposed to said oxidizing atmosphere. Conducting portion 45a therefore electrically connects strip portion 46b' with portion 44" in the lower conducting layer 44. If it is desired to deposit or secure other circuit elements or conducting or semi-conducting materials for connection to circuit elements in any particular layers a mask may be used for the etching of selected areas of the layer or layers therebeneath so that material may be deposited in the resulting cavity or secured therein and may be retained below the surface of the layer. By completely filling the cavity with material, an uninterrupted surface may be presented for the next layer to be deposited on.

Illustrated in FIG. 9' is a further circuit construction which may be applied to a circuit member such as 40. Shown are three deposited layers of conducting and non-conducting material. The lower layer 44x may be part of a further circuit stack or may be directly secured to a base such as 42 of FIG. 9. An intermediate dielectric layer 45' covers the conducting strip 44 and the non-conducting portion of its layer. A third layer 46x of conducting and non-conducting material is deposited on layer 45' and formed into a circuit as described. The notation 48 refers to a cavity or hole provided through two or more of the layers which cavity may be provided by mechanical or electrical drilling, milling or etching. The hole passes through a conductor 46c in the upper layer 46x, through the insulating layer 45' and through an insulating portion 44c of the lowest illustrated layer 44. A semi-conducting material may be filled or deposited by any known means in the multi-layer hole or cavity thus provided which material may form a component of substantial thickness as compared to the thickness of one of the layers. The resulting component may be electrically connected to one or more circuit elements of the upper layer by contact therewith and may completely fill the cavity or be surrounded with a potting compound to fill out the remainder of said cavity so as to provide an upper surface which is flat. Contact of the lower end of the component with a conductor in a lower strata or layer may be used to effect electrical connection therewith, whereupon that portion of the cavity or hole would be made through a conducting portion of the layer. Partly filling the hole with a conducting material such as a liquid metal or a deposited metal will assure electrical connection of the lower portion of the component with the conductor of the lower level. Electrodeposition may be employed to provide said connecting material in the hole for connecting the component placed or deposited in the hole with the conductor of the lower layer by exposing the cavity with the component therein and partly filling said cavity to the flow of vacuum or electrodeposited material.

Subsequently deposited layers of conducting material, such as layer or strip 46 applied above the dielectric layer 45, may be etched or partly converted to dielectric material for the formation of circuits and circuit components such as the described resistor portions. Capacitance circuits may also be provided where two or more layers or strips of conducting material cross each other and are separated by a thin dielectric layer of the type described. A unique capacitive-resistance circuit construction is illustrated in FIG. 10. The assembly comprises at least in part, a first conducting layer or strip 54 deposited or otherwise secured to a circuit board or base 52, over at least part of which is provided a thin dielectric layer 55. A second strip of metal 56 extends oblique or normal to 54 across 55. A portion 56c of 56 has been converted to dielectric material by masking and exposure, as described, to an oxidizing atmosphere for a predetermined time period, leaving a portion 56a of 56 in the area of cross-over. The junction 51 or cross-over area thus provides a resistance in the circuit comprising element 56 and a capacitance between 56 and 54.

Whereas the dielectric portion 56c is shown in FIG. 10 as extending only partly across the width of the strip 56, the entire width of strip 56 may be converted to the dielectric oxide compound in the manner that strip 46a of FIG. 9 is converted by exposure of the entire width thereof to said oxidizing atmosphere. The remaining conducting portion 56a may have any desired thickness from that in the order of microns or less to several thousandths of an inch depending on the characteristics desired of the resistor and the conducting layer portion. In other words, the structure of FIG. 10 may be used to provide film resistors which are an integral part of a conductor of substantially greater thickness.

As heretofore stated, dielectric coatings may be provided of coatings or films of metal deposited by vacuum deposition means on circuit members by oxidizing the film by exposure to an oxidizing atmosphere. Thin films of aluminum may be converted to aluminum oxide, a dielectric, by exposure to oxygen such as that present in air. To hasten the process, the part and/or the atmosphere may be heated. Fluoride coatings of the metal such as that obtained when aluminum is exposed to hydrogen fluoride, may also be provided and result in an effective dielectric costing for the conductor(s) of the circuit devices.

The following procedure for providing a dielectric coating on an article of manufacture is noted which will reduce the time required for processing the article and provide a coating of superior quality. The article is first heated either prior to or after its admission to a vacuum chamber, to a predetermined temperature. The article is mounted or otherwise made an electrode of the vacuum metallizing system or positioned whereby it will receive the vapor of the metal which is thereafter vapor deposited thereon. Portions of the surface of the article may be masked to prevent deposition on the surfaces thereof. Either during the vacuum deposition process while the metal is being deposited on the article or immediately thereafter, a predetermined quantity of the oxidizing material, such as hydrogen fluoride, is introduced into the chamber preferably adjacent the surface which is coated or is being coated. As a result, reaction takes place immediately while the article is at elevated temperature in the vacuum chamber. Noted advantages of this process include: (a) An improved bond of the vaporized metal to the article is effected due to the heating of the vaporized layer and the resulting effect on the physical state thereof. A molecular bond or welding of the vacuum deposited layer of metal is effected if the surface temperature of the article is in the range of 600° C. for aluminum. (b) The conversion to the oxide or fluoride dielectric compound of the metal occurs more rapidly since the coating metal is at elevated temperature. (c) The need for reheating and rehandling the article is eliminated and cycle time is reduced. The article to be coated, may be heated while in the vacuum chamber after the normal atmosphere or air has been removed therefrom, by induction heating means or other means thereby reducing or eliminating surface oxidation resulting from exposure to the air remperature and providing a vacuum coating of known composition on a surface of known composition. In other words, the quality or the coating as well as that of the surface on which it is deposited is known and may be retained without the introduction of impurities by heating the article in the vacuum chamber or in a chamber having a known atmosphere of vaporizing metal and/or oxidizing composition or atmosphere. By employing apparatus which introduces the vaporized metal and an oxidizing vapor or gas such as hydrogen fluoride simultaneously against the surface of the base or circuit board said metal may actually reach the surface of the board in a partially or completely converted or oxidized state.

Other forms of the invention are noted as follows:

The gaseous anodization techniques described may be used for oxidizing thin metal films to form dielectric materials including a variety or different metals, alloys and metal compounds deposited as films, plated, sprayed or otherwise applied to a base and/or each other for use in the fabrication of both active and passive electronic circuit elements. Semiconductors may also be formed by the described techniques. In particular, the technique illustrated in FIG. 10 may be used to form tunneling barriers and other portions of semiconductor devices of relatively thin cross section. Integrated micro-electronic circuits may also be similarly fabricated by selectively exposing selected areas of conducting and/or semi-conducting material or materials deposited as layers or films on a substrate and, in certain instances, on each other to oxidizing atmospheres.

Heating to predetermined temperatures and/or etching of selected areas of films deposited as described while exposed to an oxidizing atmosphere may be effected for causing predetermined changes in composition of the device or layer may be effected by an intense electron beam or intense coherent light beam or beams such as generated by a laser which are either directed along a fixed path while the substrate is moved or are deflection controlled to scan selected areas of the deposited material. The beam or beams may be operative to heat the selected area or areas to a temperature whereby the oxidizing atmosphere converts the heated area to dielectric material while the surrounding areas which are not so heated, are not so affected.

The oxidizing atmosphere may be replaced by an etchant such as a vapor of an acid operative to perform material conversion or etching of those areas exposed through a mask or selectively heat as described while the surrounding areas are not so heated. Semi-conducting materials such as germanium, silicon, tantalum and others may be selectively oxidized as described to form tunneling barriers, collector domains, electron sinks and integral electronic devices.

Selective introduction of certain impurities in the oxidizing atmosphere and/or electron beam may also be used to dope the film as it is anodized to provide various electronic devices.

By employing fabrication techniques as herein described a flat, helical conductor 60 which may be used as an electrical inductance may be fabricated in a variety of shapes, one of which is illustrated in FIG. 11 in which the device is formed by depositing a plurality of layers 62 of conducting metal on a substrate 61 and converting predetermined through and through portions of each layer to a dielectric material by exposure to an oxidizing atmosphere. The metal film deposited as a first layer 63 on substrate 61 in converted to a dielectric compound of the metal save for a plurality of diagonal strip portions 63C of the metal which are spaced apart and extend substantially parallel to each other. A next metallic layer 64 is deposited on the converted layer 63 over the strip portions 63C and is converted to dielectric material save for small area portions 64C aligned with portions 63C at the ends thereof. A plurality of layers of metal represented by the single layer 65 may be thereafter deposited and selectively converted to dielectric material to build up the helix in which conducting portions such as 65C overlying portions 64C remain or the entire layers after selective oxidation thereof. The uppermost layer 66 of the plurality of layers 62 to converted to the dielectric compound of the metal save for strip portions 66C which overlie the portions 65C and connect the ends of strip portions 63C through the remaining metallic interlayer elements 64C, 65C, etc. A helical conductor is thus provided and includes elements 63C, 64C, 65C and 66c of the multiple layers which may be used as an inductor. The layers 63 to 66 may contain many more layers therebetween which layers may also have other conducting elements formed or deposited therein as part of the same circuit containing said helical conductor or parts of different circuits. Formation of layer conducting elements 63C, 64C, 65C, etc. is effected by the application of masks over the areas of each metal layer where the element is to remain while exposing adjacent areas to an oxidizing atmosphere or selectively depositing metal in said areas and dielectric film onto adjacent areas. Conductors 63C, 64C, 65C and 66C forming the helical conductor 60 may also be selectively formed by selective plating or the selective vacuum deposition of said elements with the surrounding volume being filled with dielectric material by any suitable means; strip formations 63C and 66C may also be curved or shaped other than as straight strips or bars to vary the shape of the indicator or coil 60.

The technique of masking and oxidizing only selected through and through areas of conducting films or coatings to provide conductors or circuit elements in the remaining areas may also be used to fabricate switching matrices as follows:

(a) First mask a conducting surface such as a sheet of glass and sputter or otherwise vacuum deposit components as magnetic film materials on selected areas thereof which become thin film switching elements.

(b) Next mask over the magnetic materials and sputter or otherwise vacuum deposit a second conducting metal on remaining areas.

(c) Next mask part of the second metal and convert areas therebetween to dielectric compound of the metal by exposure to an oxidizing atmosphere leaving conducting elements or strips connecting the components or overlying the components.

(d) Layers of such components and/or conductors may be formed one on the other to provide switching matrices, circuits, etc.

Figure 12:
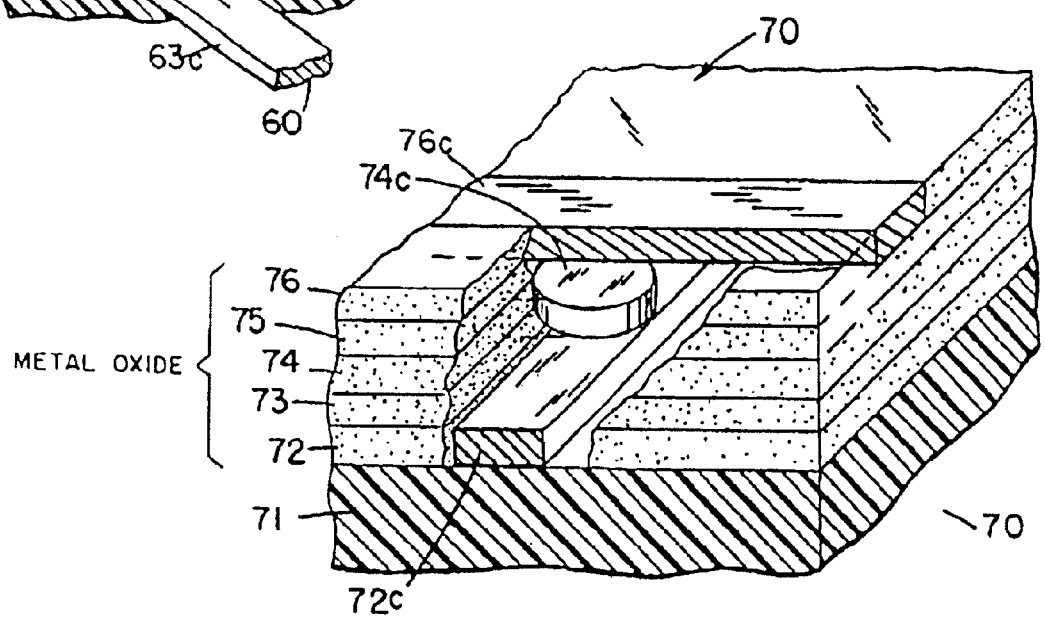
FIG. 12 is a fragmentary sectional view of the formation of a switching matrix in accordance with the instant invention.

FIG. 12 illustrates part of a switching matrix 70 formed by the selective oxidation of alternate layers of metal vapor deposited on a non-conducting base 71. A first layer 72 is deposited on 71 and oxidized save for a strip or plurality of paralleled strip portions 72C thereof. A second layer 73 of metal is sprayed or vacuum deposited on the upper surface of layer 72 and completely oxidized. A third layer 74 is deposited on 73 except in a plurality of volumes of cylindrical or other shape in which are deposited magnetic material such as nickel or other ferro-magnetic alloys which define electronic components, memory devices or cores 74C operative to generate magnetic fields which are oriented in accordance with signals generated in conductors 72C and 76C. Such structure is effected by deposition procedures involving masking. A fourth layer 75 is deposited on top of 74 and is completely oxidized to form a dielectric layer. A fifth layer 76 is deposited on top of 75 and is oxidized with the exception or parallel strip areas 76C which remain as conducting metal, strip areas so aligned that 72C and 76C cross each other in alignment with component 74C. A current passing through either conductor will thus affect magnetization of 74C. The ends of conductor elements 72C, 74C are electrically connected to computer input switching means.

Means other than the hereinbefore described technique of vacuum deposition of metal film and conversion of portions thereof to oxide film may be employed to fabricate devices of the type illustrated in FIG. 12. Techniques involving the selective area deposition of metallic films, semi-conducting and insulating materials by solution deposition or plating, sputtering or electron beam deposition means may be employed to supplement or replace the hereinbefore described fabrication means. With respect to the latter means, it is noted that metals, non-metal and semi-conducting materials may be selectively introduced in predetermined quantities into an electron beam, vaporized and carried thereby in an ionized state to selected areas or the surface of the workplace or substrate for the selective deposition thereon to form circuits, circuit elements and switching matrices as hereinbefore described.

The hereinbefore described procedures for fabricating electrical circuits and circuit elements by partially anodizing or oxidizing metal coatings or films applied to a substrate or other coatings, may be utilized for the fabrication of insulated electrical conductors such as elongated strips and wires of metal as well as single or multiple layer cables made of a plurality of thin strip conductors formed by metallizing a host of insulating material such as a polymer or insulated metal sheet with a thin film of metal end oxidizing or anodizing isolated spaced apart parallel strip areas of the film to electrically isolate the remaining parallel conducting strip areas of metal film. The following procedures are herein presented as forming a part of the current invention:

I. In a first method, an elongated member made of aluminum or aluminum alloy is formed and provided as a wire, strip or other shape the exterior surface of which is either coated with high purity aluminum and anodized or oxidized or is directly anodized or oxidized as it is formed by drawing, rolling or extruding the member to shape. The coating or anodized surface layer is thereafter exposed to said oxidizing carriers of fluorine or the like to provide a fluoride dielectric film on the exterior surface of the wire or strip. Cold working by drawing or reverse rolling the conductor may be applied either prior to or after providing the dielectric film providing an improved wire type conductor and insulation means therefore since the anodized layer improves the strength of the structure while the dielectric film provides an insulating layer which is superior to the anodized coating alone. If cold worked prior to the application of the fluoride atmosphere, the anodized layer or coating may provide a hard, non-porous shoaving or coating on the aluminum conductor base or coating thereon which coating also improves the adhesion between the dielectric insulation formed thereafterr and the wire. The same procedure may be applied to shapes other than wires of constant cross section or parallel strips such as circuit elements, connectors, etc. Such a procedure may offer a substantial improvement over the procedure involving conversion of the surface layer or a film coated thereon to dielectric film or oxide film without previously anodizing and cold working the anodized layer due to improvements in the bond and hardness of the subsurface structure defined by the anodized layer.

The first method may also be modified whereby the base shape or wire may comprise copper or any suitable metal which is coated with aluminum which is partly or entirely anodized prior to the conversion of the surface layer thereof to a fluoride dielectric film or coating.

Strip conductors or wires made of multiple layers of conducting metal electro deposited or vaporized on layers of dielectric film (with or without intermediate anodizing and cold working) may be formed as described, on a continuous basis by completely or partially converting each layer to a dielectric film as described with interposed layers or strip portions thereof remaining unconverted to serve as conducting elements.

II. In a second method, a conductor such as a wire, strip or strips of copper, aluminum or alloys thereof is moved through an opening or openings in a wall of a chamber from a supply thereof such as an extruder of said metal or drawing mill, in which chamber an oxidizing carrier or fluorine such as hydrogen fluoride or elemental fluorine is continuously introduced and caused to flow against the wire or wires after heating said wire by induction or electron or laser radiation beams means to raise its temperature in the range of 300 to 600 degrees centigrade. The conductor is maintained as it travels in said chamber in said oxidizing atmosphere until a dielectric film of fluoride of a desired thickness has formed on the aluminum surface or coating on the base whereafter it is continuously fed through a cooling zone in said chamber. A further opening in a wall of the chamber, which like the first opening, sealingly receives the wire which passes therefrom to a coiling or further processing apparatus.

III. Fluoride dielectrics of the type hereinbefore described may be utilized for insulating and protecting articles such as wire, fasteners, clips or other devices having the major portion thereof made of a ferrous metal such as steel. As the fluoride dielectrics are formed on the base metals at temperatures in the range of 300–600 degrees centigrade (500–1100 degrees Fahrenheit) and, since many steels may be tampered and hardened in this range and the fluoride dielectric forms to a suitable thickness in about the time it requires to form such steel transformations as martensite pearlite and spherodite, a process is herein proposed which includes the simultaneous formation of such steel transformations and the provision of a fluoride dielectric coating as described. The procedure may include heating the ferrous metal alloy base and processing the surface thereof to suitably receive an aluminum coating, coating with aluminum or other suitable metal, maintaining or varying the temperature thereof to provide it at the desired degree to form the dielectric coating and tempering or hardening the base metal, converting all or part of the coated metal to said dielectric, fluoride insulating compound and either slowly or rapidly cooling the article and coating thereafter to provide the base metal in the desired grain structure. Slow cooling will result in a pearlite structure whereas fast cooling attained, for example by quenching, will result in the martensite or sphorodite structure depending on the temperature at which cooling is started and the rate of cooling.

Steel wire or cable may be continuously processed as hereinbefore described by the continuous coating thereof with aluminum and conversion of all or part of the coating to the fluoride dielectric compound of the aluminum.

As both the coating and fluoride film techniques require substantially clean, scale-free surfaces, it is proposed to eliminate the need to clean and initially heat the metal in the processing of elongated shapes such as wire by extruding or hot rolling said metal wire from either the liquid or semi-molten condition directly into the chamber containing the oxidizing compound of fluoride so as to prevent the introduction of other impurities into the surface being coated and so treated. The procedure may include wording the base metal and/or coating thereon prior to or after cooling so as to improve the strength and surface characteristics thereof by rolling, bending or the like. Rapid cooling may be effected of the elongated shape after it is coated so as to form a crystaline structure of the base portion thereof having desired characteristics as described.

In a still further improvement in the hereinabove provided procedures for fabricating and protecting metal by anodizing the surface thereof or a coating of anodized material deposited on the surface of the article, said anodized coating or layer may be further improved by cold and/or hot working same. Where the total is continuously formed and fed as described, the working of the anodized layer may be performed also on a continuous basis. Such working may be effected by passing the shape through rolls and/or other means, including sizing in a die, shot peening, ultrasonic vibrations applied to the dies or rolls, etc. Coating by means of induction heating the core metal, dies, rolls etc. may also be probided to treat said anodized layer and improve its characteristics or bond.

Figure 13:
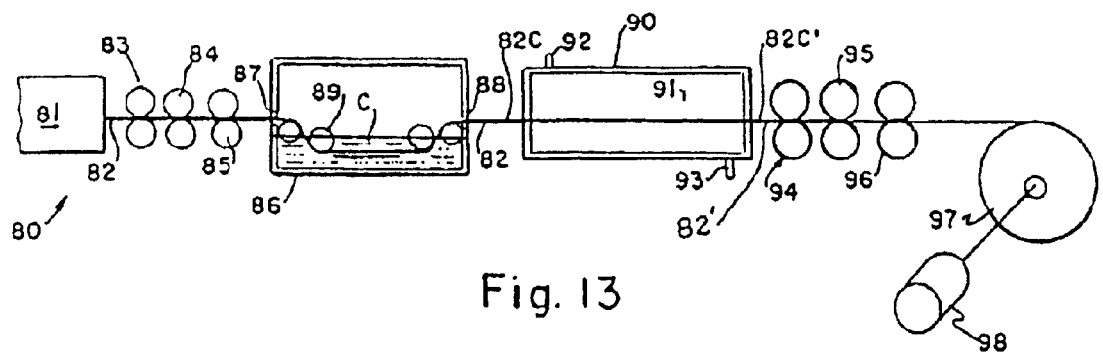
FIG. 13 is a schematic diagram of an apparatus for producing elongated electrical wires and the like having a surface layer or coating of a non-conducting metal oxide produced by the techniques herein defined and FIG. 14 is a flow diagram showing the steps involved in processing a wire by the apparatus of FIG. 13.

FIG. 13 shows an apparatus for effecting the described process for continuously processing shapes such as wires, rods and buses or other structural members to render insulating and wear resistant coatings on their surfaces. The apparatus 80 includes an extruder 81 or continuous casting machine for continuously forming a first shape 82 of metal which may be fed thereafter directly to a rolling mill 83 containing sets of upper and lower rollers 84 and 85 which are power driven to perform either or both the functions of working the member 82 and more precisely predetermining its shape. From mill 83 the shape 82 is fed to a tank 86 through an opening 87 in a wall thereof and is guided by rollers 89 supported within the tank into a pool C of molten metal such as aluminum. By means of conventional coating techniques, the shape 82 is coated with metal from the pool C. If the metal 82 is steel or copper, it may be molecularly bonded with aluminum from pool C provided that its temperature as extruded or cast and as fed into the pool C is above the melting temperature of the aluminum.

The shape 82 may be fed through a seizing die 88 at the exit opening in the tank 86 passing therefrom with a coating 82C thereon which may vary from a thousandth of an inch to several thousandths of an inch or more in thickness. The shape is then passed through a second tank 90 containing a liquid or vaporous chemical such an described which is operable during the passage of said shape through said tank to convert all or part of the coating 82C to a non-conducting compound of the metal coating. The coating may comprise aluminum oxide or other compounds of aluminum having the desired dielectric characteristics, hardness and wear resistence. From tank 90 coated shape 82' is fed to a second rolling mill 94 having upper rolls 95 and lower rolls 96 which cooperate to work the dielectric coating 82C on the the surface of the shape 82. The rolls 95 and 96 may also be operable to work the metal beneath the coating to improve its crystalline structure and, in certain instances change its shape or cross section.

A number of variations in the operation of the apparatus 80 are noted. Firstly the rolling mill 83 may be eliminated if the shape is produced to the desired dimensions by extruding or casting machine 81 or if the rolling mill 94 is operable to properly finish the shape and its coating. Secondly, rolling mill 94 may be eliminated if the coating 82C is of proper and desired characteristic as formed. Further, means other than molten metal coating, such as electro-plating, electroless plating, spray coating, etc. may be utilized to provide a suitable metal coating on the exposed surface or an predetermined portion of the shape 82.

Tank 90 contains an inlet 92 to its interior 92 and an outlet 93 therefrom for flowing anodizing or oxidizing chemicals to the inside thereof. Such chemicals may be controllably flowed to volume 91 or against the surfaces of shape 82 on a continuous or an intermittent basis. Tank 90 may be sufficiently long to permit the desired conversion of the coating 82C to the non-conducting compound of the metal. If the shape 82 is wire, it may be guided and driven back and forth around a plurality of powered rollers within tank 90 to extend its time therein. A master controller or computer may be utilized to control the operation of extruder or casting machine 81, the various powered rolls and mills, the supply of molten metal to pool C in tank 86 as well as the temperature thereof, the flow of chemicals into volume 91 and their removal or circulation and the operation of take-up roll or coiler motor 98 operating coiling machine 97.

Figure 14:
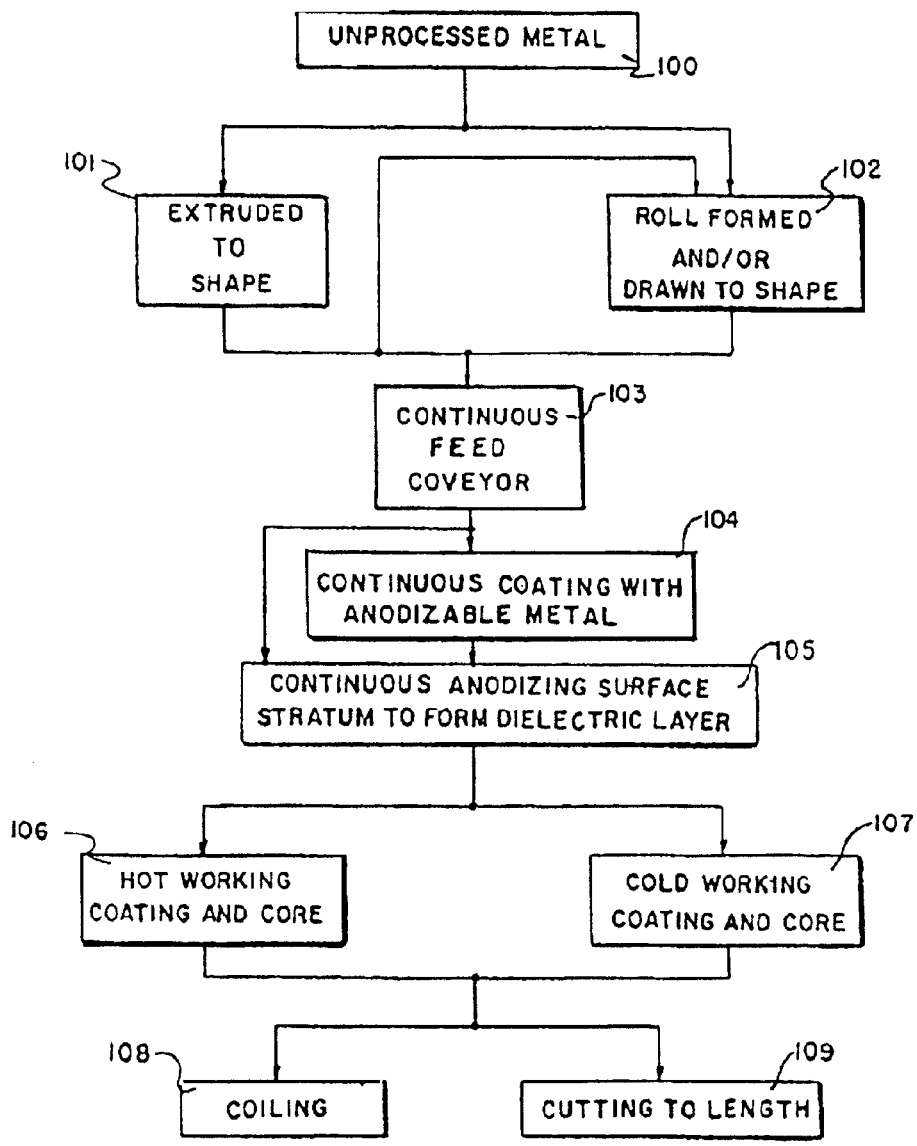

In FIG. 14 processes using the apparatus 80 are illustrated. The unprocessed metal 100 in billet, powder or other form is fed and shaped either by extrusion means 101 or continuous casting means or, if it is already shaped, it is finished by means of roll forming or drawing means 102. Thereafter, the shape is fed by continuous conveyance 103 to continuous coating means 104 where it is continuously coated with metal. Note that this step may be bypassed if the shape is of a metal such as aluminum which may have its surface stratum converted to the non-conducting oxide or compound in the continuous anodizing step 105.

In yet another form of the invention, all or portions of the structures illustrated in FIGS. 1–14 may be formed of one or more of the known semi-conducting materials to provide electrical circuit components or integrated circuits thereof with conducting and non-conducting components applied and formed as described. For example, the elements 14, 14", 14a and/or 17 of FIGS. 1–4, either or both the elements 36 and 36 of FIGS. 7 and 8 or any of the metallic elements of FIGS. 9 and 10 may comprise suitable semi-conducting materials or components thereof which are converted to the non-conducting oxides thereof, as described along selected portions of the original layers or films thereof which are deposited or otherwise applied to the substrates. Such semi-conducting films as silicon, germanium, compounds of GaAs, InP and InAs, CdS, CdSe, PbS and ZnS, SiN (silicon Nitride) etc. may be deposited by various known means such as vapor or electroless deposition or other means or may be epitaxially grown on the substrates described and illustrated in the drawings and thereafter selectively anodized or converted to non-conducting oxides or other compounds thereof to provide semi-conducting material pathways or to isolate portions of the deposited materials for the fabrication of a variety of electrical circuits and circuit elements employing conducting, semi-conducting and insulating components which may extend as a multiplicity of same to provide high density integrated circuits capable of performing switching and logic-computing functions at high speeds.

In addition to the use of copper and aluminum for the metal films which are anodized in situ on the substrates described or on each other, materials such as tantalum, silicon, nickel, nickel-chromium and other highly conducting metals and alloys or compounds thereof may also be used for the originally deposited films described herein which are selectively converted in situ to the non-conducting or to semi-conducting compounds thereof.

It is also noted that the metal films described and illustrated in the drawings may also comprise super conducting films such as films of lead, tin and indium which are selectively converted to non-conducting or semi-conducting compounds thereof by selectively exposing them to suitable chemicals for effecting such conversion. Ferromagnetic films employed to produce switching elements or arrays thereof on the substrate or on previously deposited film materials may also be selectively converted to non-magnetic film materials in areas such as described above to provide selective strips or otherwise shaped portions of the magnetic films in circuit with conducting films which are formed as described to provide high density arrays of switching device such as memories and the like.

Accordingly the single and multi-layer circuit structures illustrated in FIGS. 1 to 12 may have the conducting portions thereof formed of suitable superconducting material in sheet or film form to provide superconducting electrical and electronic circuitry, such as computing and computer circuitry operable to conduct, store and switch signal information as well as to selectively transduce, sense and transmit signal information at very high speed and with little if any measurable energy loss. Select portions of such superconducting material or materials may be converted to non-conducting and/or semiconducting forms thereof by selectively oxidizing or otherwise converting same to non-conducting and/or semiconducting compounds thereof employing the chemical conversion techniques described above or modifications thereof with or without the selective application of radiation such as heat, laser, electronc beam, x-ray or other form of radiant energy to select portions of the superconducting materials making up respective portions of the circuitry to effect such chemical changes in the superconducting material. Similarly all or select portions of metal and/or ceramic compounds applied as a layer or layers to a substrate may be converted to superconducting material by the selective oxidation of one or more metals or metal compounds thereof by means such as described above.

As set forth above, the apparatus of FIG. 13 and the process illustrated in FIG. 14 may be employed per se or modified as described hereafter for the production of elongated wire, strip or cable defining one or more electrical superconducting paths for the transmission and/or storage of electricity. For example, the unprocessed metal 100 which may be extruded, cast, roll formed and/or drawn to shape therefrom,may be formed of any suitable material such as a metal or metal alloy which is employed as a supporting substrate per se and coated as it is fed with one or more layers of superconducting material separated from the core substrate by a layer or layers of insulating material deposited on the outer stratum thereof as described and/or one or more layers of insulating material. A small portion or a major portion of the wire or strip 82 may also be converted to an insulating compound and/or a superconducting material as it is fed through one or more chambers which contain automatically controlled means for effecting such material conversion and processing. Such processing equipment may also include means for adding one or more layers of superconducting material per se and/or interposed between deposited or converted layers of insulating material to provide either an improved single layer superconducting wire with a single current path or multiple layers of superconducting material providing multiple superconducting paths. The apparatus of FIG. 13 may thus also be employed to provide a high strength insulated wire as a supporting substrate for one or more layers of superconducting material coated on or above the outer surface of the insulating dielectric coating 82' as such wire is conveyed beyond tank 90 by suitable processing means such as roll or spray coating, extrusion coating, vapor, plasma or other form of chemical deposition means located within the reaction chamber or chambers receiving the wire substrate and operable to either continuously deposit superconducting material or a plurality of materials such as metals and metal oxide(s) which form a superconducting layer or layers on the wire when they controllably deposited simultaneously and/or sequentially onto the wire, tube or strip 82.

Figure 15:
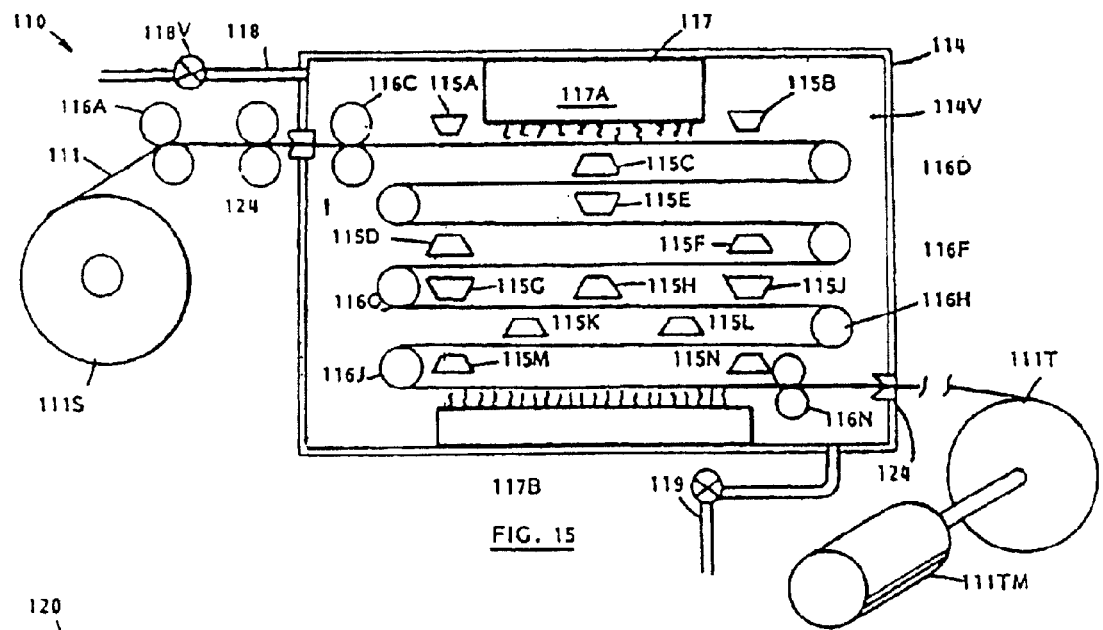
FIGS. 15 and 16 are schematic diagrams of a respective modified form of the apparatus of FIG. 13; and 20

FIG. 15 illustrates a modified form of the system 80 of FIG. 14 wherein an elongated metal wire, strip or cable 111 is fed from a supply such as a coil 111c, continuous casting, extrusion and/or roll forming or die drawing apparatus (not shown) and driven into and through a first chamber 114 in which one or more of the following fabrication functions are performed thereon while such elongated member or a plurality of same in parallel, is driven along a select path therein, such as defined by a plurality of dies, wheels, or rollers 116A to 116N which serve to guide the wire or wires past continuously operating and controlled processing means:

I. All or a select amount of the outer stratum of the elongated member 111 is converted to non-conducting, semi-conducting and/or superconducting material in the chamber 114 by processing means which includes means for continuously admitting suitable gaseous and/or vaporous chemicals at one or more select locatios of the chamber as the wire 111 is driven therethrough. Such flow of reaction material maybe automatically controlled to establish and maintain a select density thereof throughout the chamber volume 114V and/or by providing deposition or flow heads 115A to 115N therefor supported within the chamber 114 and positioned to direct select streams thereof against the entire outer surface of travelling wire or wires 111. The system 110 may also include one or more means 117 for generating and directing radiation such a microwave radiation, induction and/or other form of radiant energy as described, through the chamber 114 and against both the gas or vapor therein and one one or more lengths of the wire or strip substrate 111 as it is driven in parallel paths close to itself within the chamber. Said insulating material can comprise a thin layer of synthetic diamond material which is formed in situ on said outer surface, and can act as a coating. The synthetic diamond layer can be formed by passing the elongated member with superconducting material thereon to an atmosphere of hydrogen and a gas, such as methane, containing carbon atoms. The gas is then subjected to microwave energy of sufficient intensity to effect the formation of synthetic diamond material on said outer surface.

II. A plurality of layers of the same or different superconducting materials may be deposited under computer controlled conditions within the chamber 114, one above the other, to provide a stratum of superconducting material for the long distance conducting and/or storage of electricity. Such stratum may have an insulating material formed, as described, of its outer layer and/or one or more layers of the same or different insulating materials coated against its outer surface continuously as it is fed through chamber 114 or a separate coating chamber.

III. Plural layers of superconducting material of the same or different composition may be so formed or deposited on the substrate wire or strip or a preformed cable, each after a layer of insulating material has been formed or deposited on the previous layer as described, within the chamber 114 or a plurality of such chambers. Such plural concentric layers of superconducting material may each be employed to carry respective currents or signals or may be constructed with interconnecting means, such as one or more controlled gates or switches to pass current therebetween for the purpose of storing and/or otherwise utilizing same in various electrical devices and systems. Such layers of insulating material may be formed, as described of the outer stratum of each layer of superconducting material formed or deposited above the previous layer or may be formed of metal film which is plated or vapor deposited thereon or of a layer of such insulating material deposited on the outer surface of the previously deposited layer of superconducting material. Such plurality of layers can also be formed by depositing carbon atoms to form insulating layers of synthetic diamond material between layers of superconducting material. Each layer of superconducting material may be deposited per se from a solution, solid particles thereof, extrudate or strip, gas or vapor or a combination of such layer forming processes with or without the use of radiant energy to effect the lamination and/or formation of suitable superconducting layers on the substrate or previously deposited layer(s).

In FIG. 15, an inlet to the tank volume 114 is connected to a duct 118 extending from an inlet valve 118V which is connected to a pump (not shown) and a supply of liquid chemicals) to be sprayed or vaporized and controllably admitted to reaction chamber 114 while an outlet duct 119 permits controlled removal of liquid or gas from the chamber through an exhaust valve 119V. The two valves and/or pump are controlled in their operation by signals derived from a master controller or computer which receives and processes data from one or more sensors sensing process variables such as coating thickness, temperature and atmosphere in the chamber volume 114V.

The wire or strip 111, or plural array thereof, is driven back and forth in a path causing portions of such wire to travel parallel to the other portions and permitting microwave energy from a pair of microwave energy generators 117A and 117B disposed at the top and bottom of the chamber to intersect such parallel lengths of wire and heat same as well as coating material(s) applied to the wire through a plurality of spray heads or nozzles 115C to 11N supported along the path of the wire, as shown. The heads 115 may electrostatically or otherwise apply particles of liquid or solid materials and/or one or more chemicals for forming the superconducting and/or insulating compound thereof as one or more layers or films of the types described hereafter.

Notation 124 refers to dynamic seals secured to respective portions of the end walls of chamber 114 for receiving the uncoated and coated wire or strip passing into and out of the chamber to retaing the interior volume 114V under positive and/or negative pressure during processing the wire or wires. Such seals may be eliminated if the supply and takeup coils and mounted within the chamber and are replaced when the chamber is opened at the end of each processing to remove a coil of processed cable and replace the supply coil with a new coil. In FIG. 15, a takeup coil 111T is shown rotationally supported outside the chamber and is controllably driven in rotation during processing to take up and coil the conducting cable so formed.

The apparatus 80 illustrated in FIG. 13 may thus be modified for the automatic and continuous production of wire, strip and cable having one or more strip portions or layers thereof made of superconducting material applied in one or more chambers or tanks through which one or more of such elongated substrates is continuously driven to complete the single or multiple strip or layer conducting device. In addition to the technique of dip-coating as shown in FIG. 13 and/or in substitution therefor, one or a plurality of such aligned tanks or reaction chambers may contain automatically operable and controllable material coating means such as liquid atomizing and spraying means, plasma spraying means, sputtering and/or electron beam deposition means, roller or die coating means, extrusion or laminating means for applying one or more strip-like and/or concentric layers of superconducting material or materials, suitable insulating material and, if required, conducting material or materials to automatically fabricate requisite elongated superconducting wire, cable, strip or other products.

Figure 16:
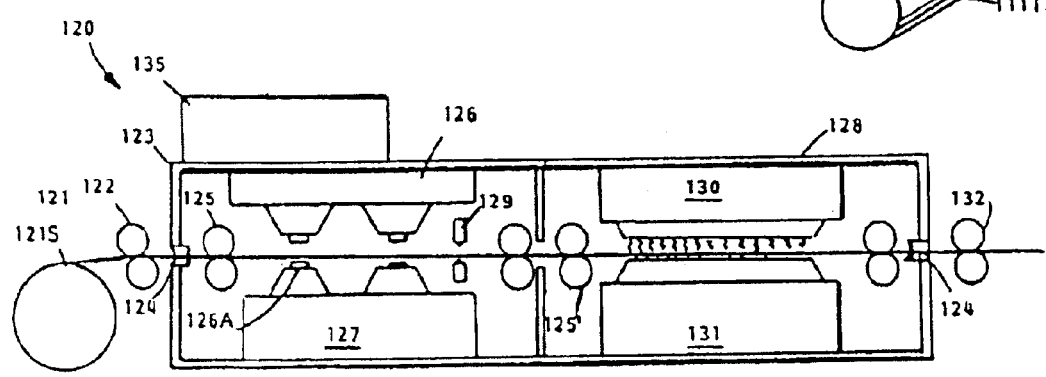

FIG. 16 illustrates modifications to the apparatus of FIG. 13 employing such a system 120 for the in-line processing of wire, strip or cable to form one or more superconducting layers thereon or strip-like portions of a single layer to provide plural resistance free current/signal paths. Two aligned reaction chambers 123 and 128 are shown, although one or more may be employed to receive and process one or a parallel array of wires, strip or cables fed from a coil or coils 121R thereof or from a continuous forming means, such as an extruder, die or roll forming means as described. At least one of a plurality of rolls 122 receiving the wire or cable 121, is powered by a motor (not shown) which is operable to feed same through a dynamic seal 124 to a first reaction or coating chamber 123. Such coil or coils may also be rotationally supported and power rotated within the chamber 123 eliminating the need for such a dynamic seal. Located within chamber 123 is an automatic coating apparatus 126 which either operates continuously in an open loop control system or in a closed loop system employing one or more sensors 129 for sensing process variables and providing feedback signals which control the coating device or devices in accordance with signals output by a computer 135 in response to such feedback signals.

If a single coating, such as a thick layer or film of a superconducting material, is to be applied to the outer surface of the wire, strip or cable 121 or the surface of an insulating material coating same, it may be applied in chamber 123 by one or more spray nozzles, plasma spray heads, sputtering electrodes, electron guns or the like denoted 127 which make up the coating apparatus 126 in chamber 123. Similar coating apparatus or modifications thereof may also employed to effect a suitable single layer coating or a plurality of space separated coatings interposed with respective coatings of insulating material applied by similar spray, sputtering or beam deposition means or by converting the surface stratum of each previous layer deposited to an oxide or other insulating compound by the means described above, in the same or subsequent chambers through which the wire or wires pass.

From chamber 123,the wire or wires pass to a second chamber 128 containing further processing means, such as a microwave energy generator 139, 131 or other suitable means for applying heat to the coated wire or cable to properly set or otherwise process the layer or layers of superconducting material and/or an outer protective layer or sheathing applied thereover in the chamber or chambers through which the composite material passes. Notations 125 and 129 refer respectively to pairs of powered rollers supported in chambers 123 and 128 for guiding and driving the wire or cable through such chambers aligned with and past the respective spray or application heads and the heating means. Outer coatings for protecting and insulating the wire or cable 121C may comprise one or more layers of a suitable polymer, such as polyethylene, polyimide, polyurethane or other plastic applied by extrusion coating within or beyond the chamber 128 or one or more layers of an insulating material such as aluminum oxide or other metal oxide applied by spray, plasma or other means or, as described above, by oxidizing a metal coating or film applied by vapor or chemical deposition in one of the chambers through which the processed wire or cable is driven.

From the last chamber 128, the coated wire, strip or cable 121C is driven by powered rolls 132 onto a coil 133 by a controlled motor 134. Notation 135 refers to a master controller or computer supported by one of the reaction or coating chambers or located a distance therefrom and operable to control the coating operation as described, by processing and analyzing information signals generated by sensors located within the chambers for sensing various process variables such as motor and drive feeds, chamber atmospheres, pumps and valves associated with coating material feeds, energy and radiation powering and output by the application heads and heating means described.

Figure 17:
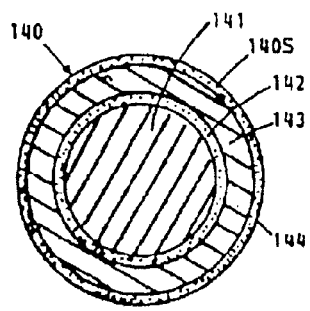
FIGS. 17, 18 and 19 are sectional views of improved superconducting cables produced by the systems of FIGS. 13, 15 and 16.
Figure 18:
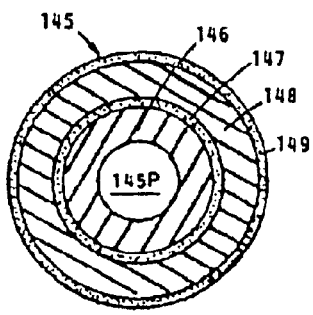
Figure 19:
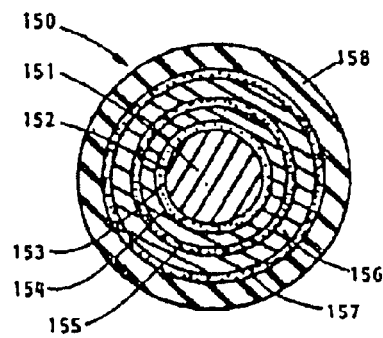

In FIGS. 17 to 19 are shown structures in a number of wires or cables produced by means of apparatus of the types described above and illustrated in FIGS. 15 and 16 of the drawings. In FIG. 17 a wire or cable 140 is formed with a cylindrical outer surface 140S having a core 141 which may be formed of a single strand of round or cylindrically shaped metal such as aluminum, aluminum alloy, titanium, copper, steel, nickel or other suitable metal or metal alloy, high strength carbon, carbon graphite, glass, ceramic or polymer or a plurality of strands or wires of one or more of such materials. In a preferred form, the core 141 is made of a drawn wire or flat strip of metal or cable formed of one or more of such wires. Shown completely surrounding the core 141 is a thin layer, such as a film 142 of electrical insulating material coated on the entire outer surface of core 141 or formed of the outer stratum thereof by oxidizing same as described. Completely surrounding the core and its coating is a cylindrical formation 143 of a superconducting material which is formed or deposited as described herein either directly on the outer surface of the core 141 or on the layer 142 if the latter is provided. The cylindrical superconducting formation 143 may be applied in film thickness or as a relatively thicker cylindrical formation depending on the overall dimensions of the elongated conductor and its desired use. A layer 144 of insulating material is depressed or formed on layer 143. While various superconducting materials may be employed for the cylindrical formation or coating 143, presently known superconducting materials which may be utilized include films of lead, tin and indium; niobium; coatings of ceramic metal-metal oxides such as compounds made of strontium or barium and lanthanium, copper and oxygen; yttrium, barium or strontium and copper; ($Y_1Ba_2Cu_3O$); or similar ceramic compounds containing bismuth or thallium replacing strontium, applied as described above or by other suitable means to the substrate as vapor or particle mixtures or separate flow streams.

In FIG. 18 is shown a modified form of elongated cable or wire superconductor 145 formed of a core formation 146 of tubular shape and having a passageway 145P extending therethrough along its length. The passageway 145 may contain a gas or heat transfer liquid such as liquid nitrogen or other form of liquid or may define or contain one or more light pipes for conducting light signals along its length for communication and control purposes. While the tubular core 146 may be made of one or more of the materials of which core 141 may be made if it is made of metal, its outer stratum 147 may be converted, as described, to an insulating oxide of the metal or coated with a suitable insulating material, such as aluminum oxide, other metal oxide or a polymer. Completely surrounding the tubular formation or wire is a cylindrical layer 148, similar to layer 143, of superconducting material. Completely surrounding the outer surface of layer 148 is a coating or sheathing 149 of a protective insulating material which, like the layer 144 surrounding and covering the outer surface of layer 143 of FIG. 17, may be formed in situ of the material of the outer stratum of 143, coated or extruded thereon or formed by oxidizing a layer of metal applied to such outer surface.

In FIG. 19, an elongated wire or cable 150 is shown formed of a core 151 of suitable metal, alloy, graphite, high strength ceramic glass or other material of substantially cylindrical shape having its entire outer surface 152 coated or formed with a thin layer 153 of electrically insulating material such as an oxide, polymer or other compound. Coating and completely surrounding layer 153 is a first layer 154 of superconducting material of one of the types described which is coated thereon or formed of the outer stratum thereof or of the outer stratum of the core material 151. Covering and completely surrounding the outer surface of layer 154 is a second insulating layer 155, again formed by coating or forming same of the outer stratum of layer 154 or a material, such as a metal film coated on the cylindrical layer 154 of superconducting material. Coating and completely surrounding insulating layer 155 is a second layer 156 of superconducting material which may be the same or of a different thickness than layer 154. Coating and completely surrounding layer 156 is a third layer 157 of insulating material. Completely surrounding the outer layer 157 is a sheathing 58 of a protective plastic or composite material which may be extruded, spirally wrapped and bonded or otherwise applied thereto.

The two space-separated layers 154 and 156 of superconducting material may be connected at their ends to conduct separate electrical currents or signals or may be interconnected at their ends and/or at select locations along their lengths by suitable gate or switch means which are automatically controlled to conduct the same current and/or signals so as to provide, for example, a conducting path which is up to twice the length of the cable or wire 150. Also, it is noted that the construction shown in FIG. 19 may be modified to include a plurality of additional layers of superconducting material or materials of the same or different conducting characteristics to provide additional conducting paths along the length of the cable which may be separate from each other or interconnected at their ends or at one or more locations along the length thereof for performing various electrical conducting and storage functions. In a particular form, the wire or cable 150 may be formed with more than two superconducting layers which are concentric with and insulated from each other and are electrically connected at respective ends in a manner to provide a superconducting path for electrical energy which is three or more times the actual length of the length of cable or wire supporting such superconducting layers. In another form, a plurality of controllable gates or switches may be provided at select locations along such a multiple layer superconducting cable for controllably switching electrical energy and signals between the superconducting layers thereof for control and suitable storage purposes. For example, as one layer of superconducting material becomes saturated with electrical energy, an adjacent layer or layers may have electrical energy or signals gated thereto from such layer or adjacent layers.

A number of methods nay be employed to provide the described insulating coatings; one by directly coating insulating material as described on the outer surface of the core or superconducting material; another by coating a first material such as a metal or other material on the surface to be insulated, then chemically converting same to the requisite insulating compound. A third method is to chemically convert the outer stratum of the previous layer, as described, by oxidizing same in a suitable chemical atmosphere. A synthetic diamond insulating layer can be formed by passing the elongated member with superconducting material thereon to an atmosphere of hydrogen and a gas, such as methane, containing carbon atoms. The gas is then subjected to microwave energy of sufficient intensity to effect the formation of synthetic diamond material on said outer surface. Such insulating coatings may vary in thickness from film thickness of a few microns to a few thousands of an inch or more depending on the operational requirements of the superconducting wire or cable. The outer protective layers 140S, 149 and 158 may also vary from micron thickness to several thousands of an inch or may be formed as relatively heavy jacketing or sheathing of substantially greater thickness again depending on the applications of diameter of the cable. Such outer jacketing may be reinforced and/or covered with high strength woven metal, plastic and/or ceramic material(s) which may also extend therethrough for tensile strength and penetration resistance.

In modified forms of the invention, electronic circuitry may be formed on a substrate of the types illustrated in FIGS. 1 to 12 which employ one or more layers of conducting polymers having similar select portions thereof converted to non-conducting and/or semi-conducting material(s) for the purposes described of forming interconnects, switching and tunnelling devices, resistors, capacitors, inductors and semiconductors as well as superconductors. Such conducting polymers may be applied to the substrate and/or subsequent layers of similar material or metal film by casting, spray or vapor deposition, roller or dip coating, through a mask and/or as a layer or layers thereof which are selectively etched or chemically converted to non-conducting material to form circuit elements of the types described, per se or in combination with one or more additional materials such as metal condcuting film and/or metal-oxide superconducting film.

While various conducting polymers may be employed for such circuit processing, suitable water soluble conducting polymers include ethane (P3-ETS) and butane tiophene sulfonic acid (P3-BTS) may be cast per se, applied through a mask or masks or by spray depositin to form circuitry and/or may be further processed to form such circuitry by selectively chemically chaning select portions of a film layer thereof, and/or by the selective electron or laser beam erosion or vaporization thereof.

The elongated conducting wire and cables of FIGS. 17 to 19 may also be formed with one or more layers of such conducting polymers replacing and/or supplementing the superconducting layers thereof. For example, the wire of FIG. 17 may have the layer 143 formed of conducting polymer. Insulating layer 142 may be eliminated if the core 141 is made of a filament or fibers made of glass, high strength graphite, ceramic or polymer or a combination thereof. The core 141 may also comprise an optical fiber or fiber optic bundle. In FIG. 16, core tube 146 may be made of a conducting polymer as may layer 148. One layer may comprise a superconducting material and the other formed of a conducting material such as a conducting polymer. In the embodiment of FIG. 19, the layers 154 and 156 as well as additional layers disposed outwardly thereof, may be made of conducting polymers employed per se or in combination with one or more layers of superconducting material and/or conducting metal film, each insulated from each other by interlayers of insulating material formed of the outer strata of the conducting layers and/or of metal film oxidixed in situ as described.

The conducting polymers described above or other such electrically conducting and semi-conducting polymeric materials, may also be employed in place of one or more of the metal and semiconducting films and layers to construct electrical circuits of the types shown in FIGS. 1 to 12 by either applying same as thin films or coatings to substrates or previously deposited materials and either chemically converting select portions of such conducting films to non-conducting compounds thereof and/or by chemically or dissolving or etching select portions of such conducting polymer films or layers, or otherwise removing same such as by electron or laser beam etching, burning or eroding same to provide circuit elements and interconnects as described and illustrated.

The superconducting materials of the devices described herein may be produced by a number of techniques including the controlled continuous production and mixing of particles of different metals and one or more metal oxides, which particle mixture is extrusion or die expressed to shape under suitable pressure and heated before and/or after forming same onto a substrate such as a wire, strip sheet or tube. Such coatings or layers of superconducting material may also be formed by chemical vapor deposition wherein all of certain of such metals and metal oxide(s) are controllably vaporized per se and/or as compounds and controllably deposited as one or more layers of such superconducting material on the substrate. Processes are noted as follows forming part of the invention:

I. A plurality of metals of the types described(strontium, bariun, lanthanium, bismuth, thallium, copper, etc.) and one or more metal oxides, such as copper oxide, are formed as powders which are controllably mixed, to provide a substantially homogeneneous mixture and are compacted in a die, between roller dies through which such mixed powders with or without a continuous wire or strip are fed or extruded with or without such wire through an extrusion die with or without a binder, such as a suitable resin to form the described superconducting material in strip, wire or coating form.

II. A plurality of metals and a metal oxide may be vaporized by resistance heating, induction, microwave or radiant energy beam, in a single chamber and the vapors homogeneously mixed and deposited onto a stationary or moving substrate such as a wire, disc, drum, sheet, or other shape which is conveyed through a chamber, wherein the layer of metal-metal oxide compound is a superconducting material.

III. A plurality of metals may be continuously vaporized and combined, such as by deposition onto a substrate wherein one or more of such metals is oxidized by heat and chemical action as it is formed and/or as or after it deposits onto a substrate, such as the described wire, cable, strip or rotating disc to form a layer or layers of superconducting material thereon as described.

IV. A plurality of metal powders may be formed and continuously flowed to controllably deposit onto a substrate such as a wire, strip, disc, sheet, etc. wherein one or more of such metal powders are oxidized as formed by the application of a chemical vapor or liquid thereto and heat generated by induction, microwave, electron or laser beam heating,etc. to form such super-conducting material on such substrate.

V. One or more metals may be vaporized adjacent a substrate and deposited along with one or more metal powders wherein oxygen is provided by oxidizing one or more of the vapor and/or solid particles as or immediately after it is formed and fed to the substrate, forming the superconducting material thereon.

In each of the processes described above, additional processing in the form of heating by means of induction, microwave energy, laser and/or electron beam heating means intersecting the substrate and/or particles, and/or die rolling, may be effected continuously on the shape or composite so formed to render the deposited compound more compact, greater in strength and superconducting. Such further processing may be carried out in batch or continuously on the composite formation as it is fed.

Accordingly notation 116N of FIG. 15 and 125', 132 of FIG. 16 may refer to suitable rolling dies which may be supplemented by additional rolling dies for compressing, compacting and sizing superconducting material(s) coated by solid particle or vapor deposition and/or other means on the wire, strip or tubular substrate by means of the coating apparatus illustrated and/or by extrusion coating means (not shown) located within or exterior of the reaction chambers 114,123 or 128.

Other forms of the invention are noted as follows:

VI. Core elements or wires 111,141,146 and 151 of FIGS. 15 to 19 may be formed of a metal, metals or metal alloys which are either superconducting per se or become superconducting when oxidized or when formed with an oxygen containing compound such as copper oxide. For example, alloys of europium, barium and copper may be formed into an elongated ribbon by directing a stream of molten liquid metal thereof onto a chilled rotating wheel, disc or drum and such ribbon may be fed directly to the apparatus of FIGS. 13,15 or 16 or modifications thereof, in such ribbon shape or after being roll formed or passed through dies to form a round wire or wires thereof. Such ribbon, wire or wires may have their outer strata continuously oxidized as described to form non-conducting film thereon before further processing as described to form one or more superconducting layers thereon. Such oxidizing may be effected to form a superconducting layer on the base wire or ribbon.

VII. A plurality of narrow thin strip-like formations of superconducting material may also be formed on the surface of a flat strip, ribbon or cylindrical wire of the surface stratum of the metal thereof or by deposition on an insulating surface thereof wherein passage of the composite wire through a die serves to remove or separate portions of the superconducting layer to form such thin strip-like formations on the substrate.

The elongated, flexible wire-like substrate on which the superconducting material is supported, as substrate 151 in FIG. 19, may be formed of a plurality of wires twisted or woven to form a high strength supporting cable, as illustrated in FIG. 20. Individual wires 160, 162, and 164 may be made of the same or different materials.

I claim:

1. A superconducting electrical cable comprising:
   (a) an elongated, flexible, solid light-conducting substrate formed of at least one strand of a uniform material having a substantially constant cross section along its length;
   (b) an outer stratum of said substrate being formed of electrically insulating material;
   (c) a first layer of superconducting material completely surrounding said substrate immediately outside said outer stratum and integrally secured to said substrate;
   (d) a second layer of insulating material immediately outside, completely surrounding, and secured to said first layer; and
   (e) said substrate supporting said superconducting material and providing major tensile strength for said superconducting electrical cable.

2. A superconducting electrical cable in accordance with claim 1 wherein said substrate is formed at least in part of high strength ceramic material, carbon or glass fibers.

3. A superconducting electrical cable in accordance with claim 1 further comprising a second layer of superconducting material covering and surrounding said second layer of insulating material and extending the length of said cable, and a third layer of insulating material secured against and surrounding said second layer of superconducting material.

4. A superconducting electrical cable in accordance with claim 1, wherein said layers of insulating material are of film thickness.

5. A superconducting electrical cable in accordance with claim 1, wherein said layer of insulating material and said layer of said superconducting material are of film thickness and are deposited or formed sequentially on said substrate.

6. A superconducting electrical cable in accordance with claim 1 wherein said substrate is made of transparent glass.

7. A superconducting electrical cable in accordance with claim 1 further comprising a sheathing reinforced with woven material therein and wherein said sheathing secures said second layer of insulating material along the length of said second layer.

8. A superconducting electrical cable in accordance with claim 1, wherein said superconducting material is formed in situ against the entire outer surface of said substrate, and wherein said superconducting material is formed of one or more deposited metals and at least one oxide.

9. The superconducting electrical cable of claim 7 wherein the sheathing is secured to the exterior of said second layer of insulating material.

10. The superconducting electrical cable of claim 7 wherein the sheathing is secured in said second layer of insulating material.

11. A superconducting electrical cable in accordance with claim 1, wherein said substrate is made of transparent ceramic.

12. A superconducting electrical cable comprising:
   (a) an elongated, optically transparent, solid, wire-like substrate having a substantially constant cross section along its length;
   (b) the outer stratum of said elongated wire-like substrate being formed of electrically insulating material;
   (c) a first layer of superconducting material completely surrounding said wire-like substrate immediately outside said outer stratum and integrally secured to said substrate; and
   (d) a second layer of insulating material immediately outside, completely surrounding, and secured to the outer surface of said first layer.

13. The superconducting electrical cable of claim 12 wherein the substrate is flexible.

14. The superconducting electrical cable of claim 12 wherein the substrate is formed of a bundle of optical fibers.

15. The superconducting electrical cable of claim 12 wherein the substrate is formed of a glass.

16. The superconducting electrical cable of claim 12 wherein the substrate is formed of a ceramic.

* * * * *